United States Patent
Ju et al.

(10) Patent No.: US 10,559,901 B2
(45) Date of Patent: Feb. 11, 2020

(54) ELECTRICAL CONNECTOR

(71) Applicant: LOTES CO., LTD, Keelung (TW)

(72) Inventors: Ted Ju, Keelung (TW); Chien Chih Ho, Keelung (TW)

(73) Assignee: LOTES CO., LTD, Keelung (TW)

( * ) Notice: Subject to any disclaimer, the term of this patent is extended or adjusted under 35 U.S.C. 154(b) by 0 days.

(21) Appl. No.: 16/188,750

(22) Filed: Nov. 13, 2018

(65) Prior Publication Data

US 2019/0173205 A1 Jun. 6, 2019

(30) Foreign Application Priority Data

Dec. 1, 2017 (CN) .......................... 2017 1 1246030

(51) Int. Cl.
| | |
|---|---|
| H01R 12/70 | (2011.01) |
| H01L 23/31 | (2006.01) |
| H01L 23/498 | (2006.01) |
| H05K 3/34 | (2006.01) |
| H01R 12/57 | (2011.01) |
| H01R 13/24 | (2006.01) |
| H05K 7/10 | (2006.01) |
| H01R 12/71 | (2011.01) |

(52) U.S. Cl.
CPC ...... *H01R 12/7076* (2013.01); *H01L 23/3114* (2013.01); *H01L 23/3128* (2013.01); *H01L 23/49816* (2013.01); *H01R 12/57* (2013.01); *H01R 12/7082* (2013.01); *H01R 12/714* (2013.01); *H01R 13/245* (2013.01); *H01R 13/2442* (2013.01); *H05K 3/3436* (2013.01); *H05K 7/1061* (2013.01)

(58) Field of Classification Search
CPC .... H01R 12/57; H01R 12/714; H01R 12/716; H01R 12/2442; H01R 12/7076; H01R 13/245; H05K 3/3436; H05K 7/1061
See application file for complete search history.

(56) References Cited

U.S. PATENT DOCUMENTS

| | | | | |
|---|---|---|---|---|
| 6,471,535 | B1 * | 10/2002 | Walkup | H01R 13/193 439/342 |
| 8,215,998 | B1 * | 7/2012 | Ju | H01R 12/7076 439/626 |
| 8,708,716 | B1 * | 4/2014 | Ho | H01R 12/714 439/83 |

(Continued)

FOREIGN PATENT DOCUMENTS

CN 201549674 U 8/2010

*Primary Examiner* — Oscar C Jimenez
(74) *Attorney, Agent, or Firm* — Locke Lord LLP; Tim Tingkang Xia, Esq.

(57) ABSTRACT

An electrical connector, configured to electrically connect to a chip module, includes: a body, used to carry upward the chip module, and provided with multiple accommodating holes; and a plurality of terminals, respectively correspondingly accommodated in the accommodating holes. Each terminal includes a base, a first arm and a second arm, the base is configured to be connected to a strip, the first arm is formed by extending upward from the base, and the second arm is formed by extending upward from the first arm and is configured to abut the chip module. One side of the first arm is formed by tearing from the strip, and two opposite sides of the second arm are both formed by blanking the strip.

19 Claims, 9 Drawing Sheets

(56) References Cited

U.S. PATENT DOCUMENTS

| | | | | |
|---|---|---|---|---|
| 2011/0065338 A1* | 3/2011 | Zhang | .................... | H01R 43/16 |
| | | | | 439/862 |
| 2011/0256771 A1* | 10/2011 | Jin | ........................ | H01R 12/52 |
| | | | | 439/626 |
| 2011/0256780 A1* | 10/2011 | Peng | ..................... | H01R 12/55 |
| | | | | 439/676 |
| 2012/0178306 A1* | 7/2012 | Ju | ......................... | H01R 12/57 |
| | | | | 439/660 |
| 2012/0202384 A1* | 8/2012 | Liaw | ..................... | H01R 12/57 |
| | | | | 439/626 |
| 2018/0198226 A1* | 7/2018 | Ju | ...................... | H01R 13/2435 |
| 2018/0331441 A1* | 11/2018 | Huang | .................. | H01R 12/57 |
| 2018/0331442 A1* | 11/2018 | Huang | ................ | H01R 12/714 |

* cited by examiner

A-A

ELECTRICAL CONNECTOR

CROSS-REFERENCE TO RELATED PATENT APPLICATION

This non-provisional application claims priority to and the benefit of, pursuant to 35 U.S.C. § 119(a), patent application Serial No. CN201711246030.0 filed in China on Dec. 1, 2017. The disclosure of the above application is incorporated herein in its entirety by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference were individually incorporated by reference.

FIELD

The present invention relates to an electrical connector, and in particular, to an electrical connector electrically connected to a chip module.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Chinese Patent No. CN200920311125.0 discloses a terminal and a strip thereof. The strip of the terminal is formed by stamping a plate, and includes a first strip, several first terminals connected to the first strip, a second strip, and several second terminals connected to the second strip. The first terminals and the second terminals are used to electrically connect a chip module to a printed circuit board, and the first terminals are structurally identical to the second terminals.

The first terminal includes a first base in a shape of a flat panel, a first connecting portion extending upward from the first base, and a first elastic portion bending and extending upward from the first connecting portion. The first connecting portion is used to be connected to the strip. The first elastic portion includes a first arm extending upward from the first base and a second arm extending upward from the first arm, and an end of the second arm is provided with a first contact portion electrically connected to the chip module. Two opposite sides of the first arm are both formed by blanking the first strip, one side of the second arm is formed by blanking the first strip, and the other opposite side of the second arm is formed by tearing from the first strip.

However, such structures of the terminal and the strip thereof have at least the following disadvantages: the two opposite sides of the first arm are both formed by blanking the first strip, which not only wastes the strip materials and fails to facilitate cost saving, but also reduces the strength of the first arm and the strength at a connection location between the strip and the first connecting portion. Because one side of the second arm is formed by blanking the first strip, and the other opposite side of the second arm is formed by tearing from the first strip, burrs formed on the two opposite sides of the second arm are located on different surfaces of the second arm. When the second arm abuts the chip module, the burrs formed on a surface of the first contact portion easily scratch the chip module, and affect the electrical connection between the first contact portion and the chip module.

Therefore, a heretofore unaddressed need to design a novel electrical connector exists in the art to address the aforementioned deficiencies and inadequacies.

SUMMARY

An objective of the present invention is to provide an electrical connector that can save costs, improve the strength of a terminal and a strip, and ensure a stable electrical connection between the terminal and a chip module.

To achieve the foregoing objective, the present invention adopts the following technical solution:

An electrical connector, configured to electrically connect to a chip module, includes: a body, configured to carry upward the chip module, and provided with a plurality of accommodating holes; and a plurality of terminals, respectively correspondingly accommodated in the accommodating holes. Each of the terminals comprises a base, a first arm and a second arm, the base is configured to be connected to a strip, the first arm is formed by extending upward from the base, and the second arm is formed by extending upward from the first arm and is configured to abut the chip module. One side of the first arm is formed by tearing from the strip, and two opposite sides of the second arm are both formed by blanking the strip.

In certain embodiments, the base has a strip connecting portion extending upward and configured to be connected to the strip, and one side of the strip connecting portion adjacent to the first arm is obliquely provided upward and toward the first arm.

In certain embodiments, the body is concavely provided with a plurality of retaining slots respectively communicating with the accommodating holes, the strip connecting portion is correspondingly accommodated in a corresponding one of the retaining slots and partially extends into a corresponding one of the accommodating holes, an opposite side of the strip connecting portion is punctured to form a protruding barb, and the protruding barb abuts a side wall of the corresponding one of the retaining slots.

In certain embodiments, the strip has a notch, the notch is located between the second arm and the strip, and before the first arm is torn from the strip, the notch extends to a connection location between the first arm and the second arm.

In certain embodiments, an end of the second arm is formed by blanking the strip such that a gap exists between the end of the second arm and the strip.

In certain embodiments, an opposite side of the first arm is formed by blanking the strip.

In certain embodiments, a width of the first arm gradually decreases along an extending direction of the first arm, the two opposite sides of the first arm are obliquely provided along the extending direction of the firm arm, and an obliquity of the torn side of the first arm is less than an obliquity of the blanked side of the first arm.

In certain embodiments, the second arm extends to a location between two adjacent ones of the accommodating holes in an adjacent row thereof, and is located between two first arms of the adjacent row thereof.

In certain embodiments, the first arm comprises a first section formed by bending upward from the base and horizontally extending away from the base, a second section formed by bending upward from the first section and extending along a vertical direction, and a third section formed by bending upward from the second section and obliquely extending toward the base, and the third section extends across a vertical plane on which the base is located.

In certain embodiments, the second arm comprises a fourth section formed by bending upward and extending from the first arm, and a fifth section formed by bending upward and extending from the fourth section, the fourth section is tangent to the fifth section, and the fifth section abuts the chip module.

In certain embodiments, a soldering portion is formed by bending downward and extending from the base to be soldered to a solder ball, the soldering portion comprises a first portion formed by bending downward from the base and horizontally extending away from the base, and a second portion formed by bending downward from the first portion and obliquely extending toward to the base, an end of the second portion is protrudingly provided with a hook portion, and each of the accommodating holes is correspondingly provided with a fastening block located above the hook portion to limit the corresponding terminal from moving upward.

In certain embodiments, a bottom surface of the body is downward protrudingly provided with a plurality of protruding blocks, the second portion and one of the protruding blocks correspondingly clamp the solder ball, and a gap exists between the first portion and the solder ball.

In certain embodiments, a bottom surface of the body is upward concavely provided with a plurality of accommodating grooves, the accommodating grooves are correspondingly communicated with the accommodating holes, and the solder ball is accommodated in one of the accommodating grooves and is soldered to the hook portion.

In certain embodiments, the base has a position limiting portion extending downward, a gap exists between the position limiting portion and the soldering portion, and each of the accommodating holes is correspondingly provided with a position limiting surface located below the position limiting portion to limit the corresponding terminal from moving downward.

In certain embodiments, the soldering portion and the second arm are located at two opposite sides of a vertical plane on which the base is located.

In certain embodiments, a plurality of supporting blocks is formed by extending upward from the body to carry upward the chip module, and the second arm is located at a side of the supporting block in an adjacent row thereof and extends across the supporting block in the adjacent row thereof.

In certain embodiments, each of the supporting blocks is provided with an oblique surface, and the oblique surface directly faces a connection location between the first arm and the second arm of the terminal in an adjacent row thereof.

In certain embodiments, the first arm and the second arm in an adjacent row of the first arm are located between two of the supporting blocks in a same row.

In certain embodiments, one side of the strip being torn to form the first arm is obliquely provided upward and toward the first arm.

Compared with the related art, the electrical connector according to certain embodiments of the present invention has the following beneficial effects.

In the present invention, one side of the first arm is formed by tearing from the strip, which not only saves the material of the strip and facilitates cost saving, but also ensures the strength of the first arm and the strength at a connection location between the strip and the base. Moreover, the two opposite sides of the second arm are both formed by blanking the strip, such that burrs formed on the two opposite sides of the second arm are located on a same surface of the second arm, and the other surface of the second arm that does not have burrs is controlled to abut the chip module, thus effectively preventing the burrs from scratching the chip module, and ensuring the stable electrical connection between the second arm and the chip module.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein.

DETAILED DESCRIPTION

Figure 1:
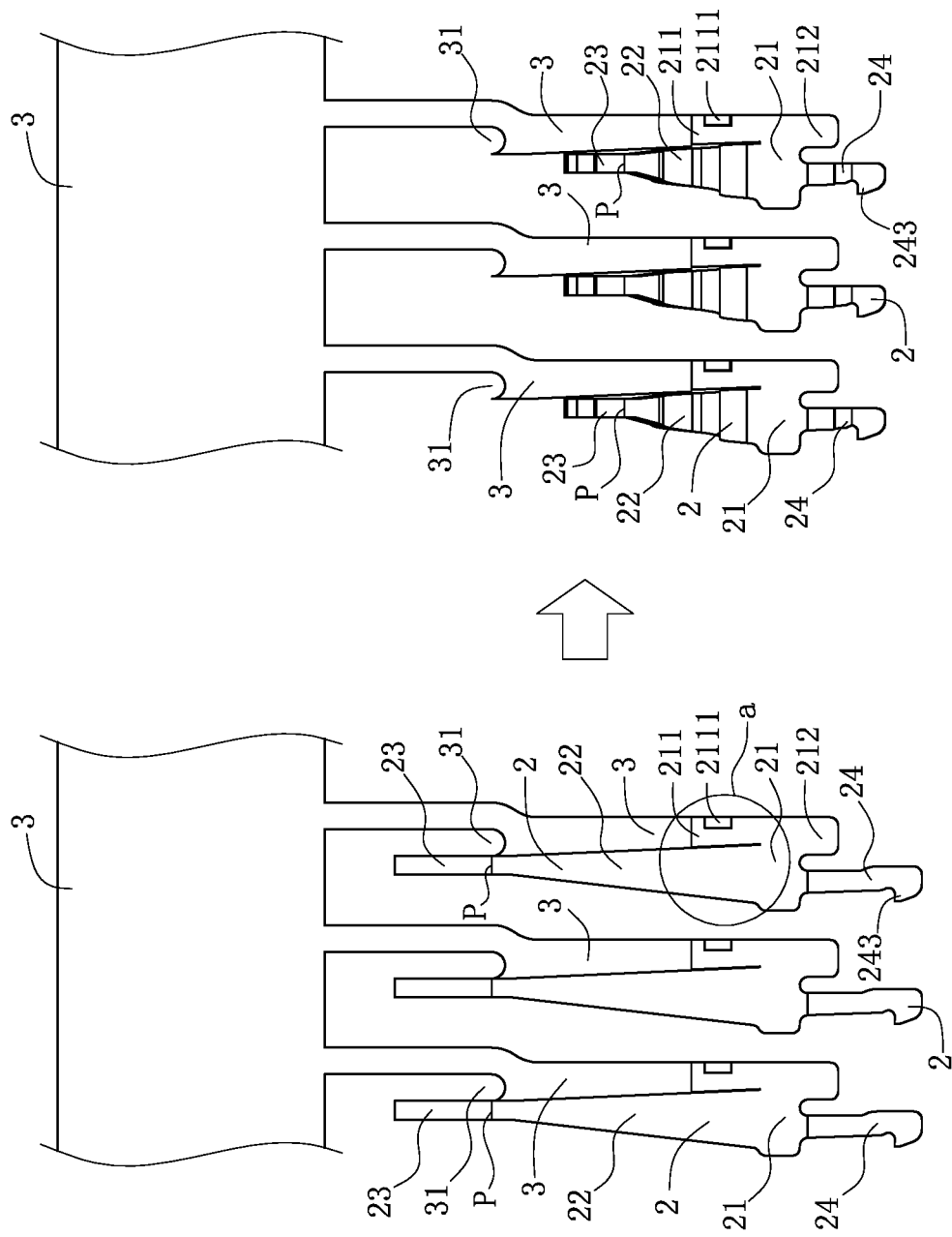
FIG. 1 is a schematic view of molding of terminals and strips of an electrical connector according to certain embodiments of the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising", "including", "carrying", "having", "containing", "involving", and the like are to be understood to be open-ended, i.e., to mean including but not limited to.

The description will be made as to the embodiments of the present invention in conjunction with the accompanying drawings in FIGS. 1-9. In accordance with the purposes of this invention, as embodied and broadly described herein, this invention, in one aspect, relates to an electrical connector.

Figure 4:
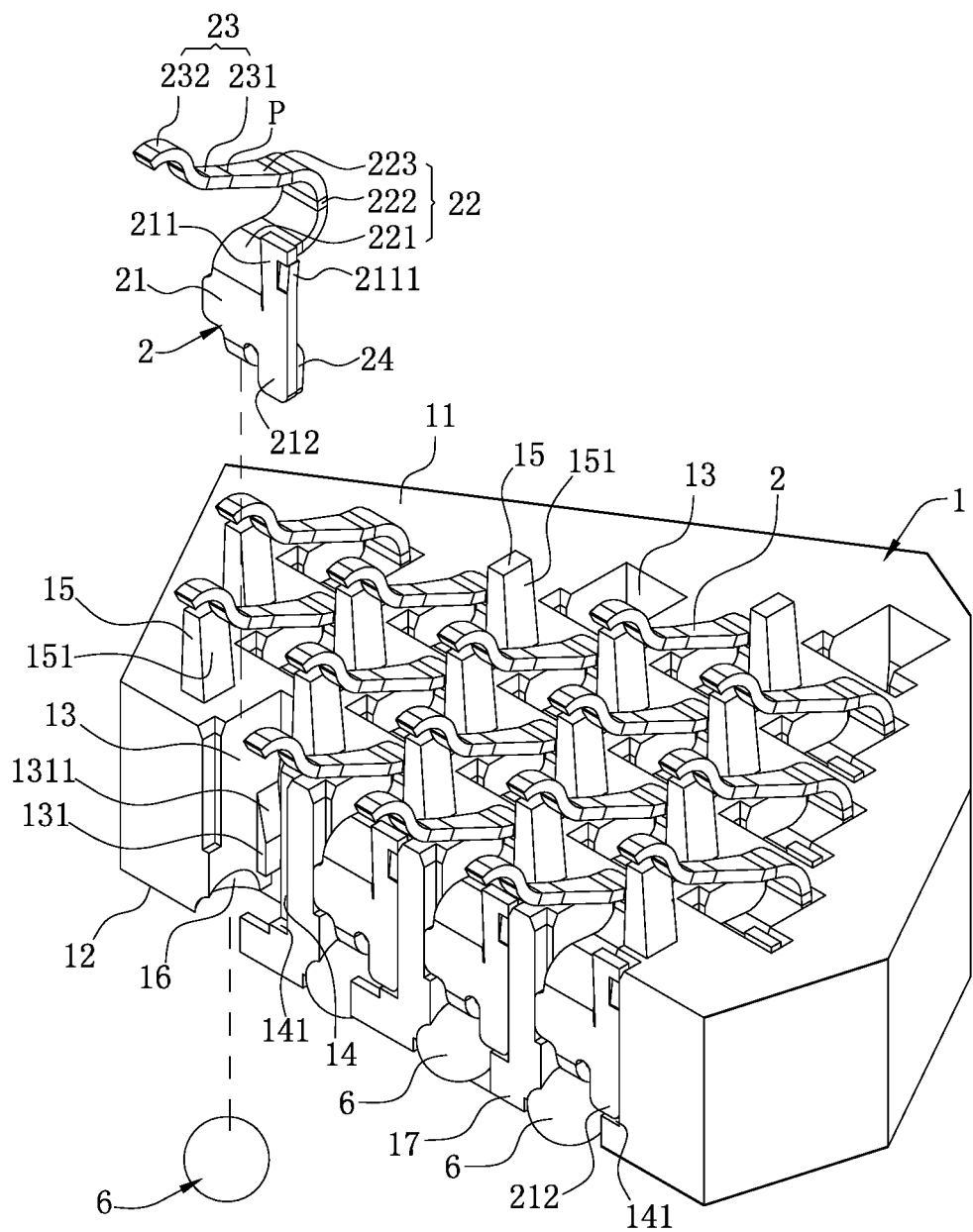
FIG. 4 is a perspective view of an electrical connector according to certain embodiments of the present invention.
Figure 6:
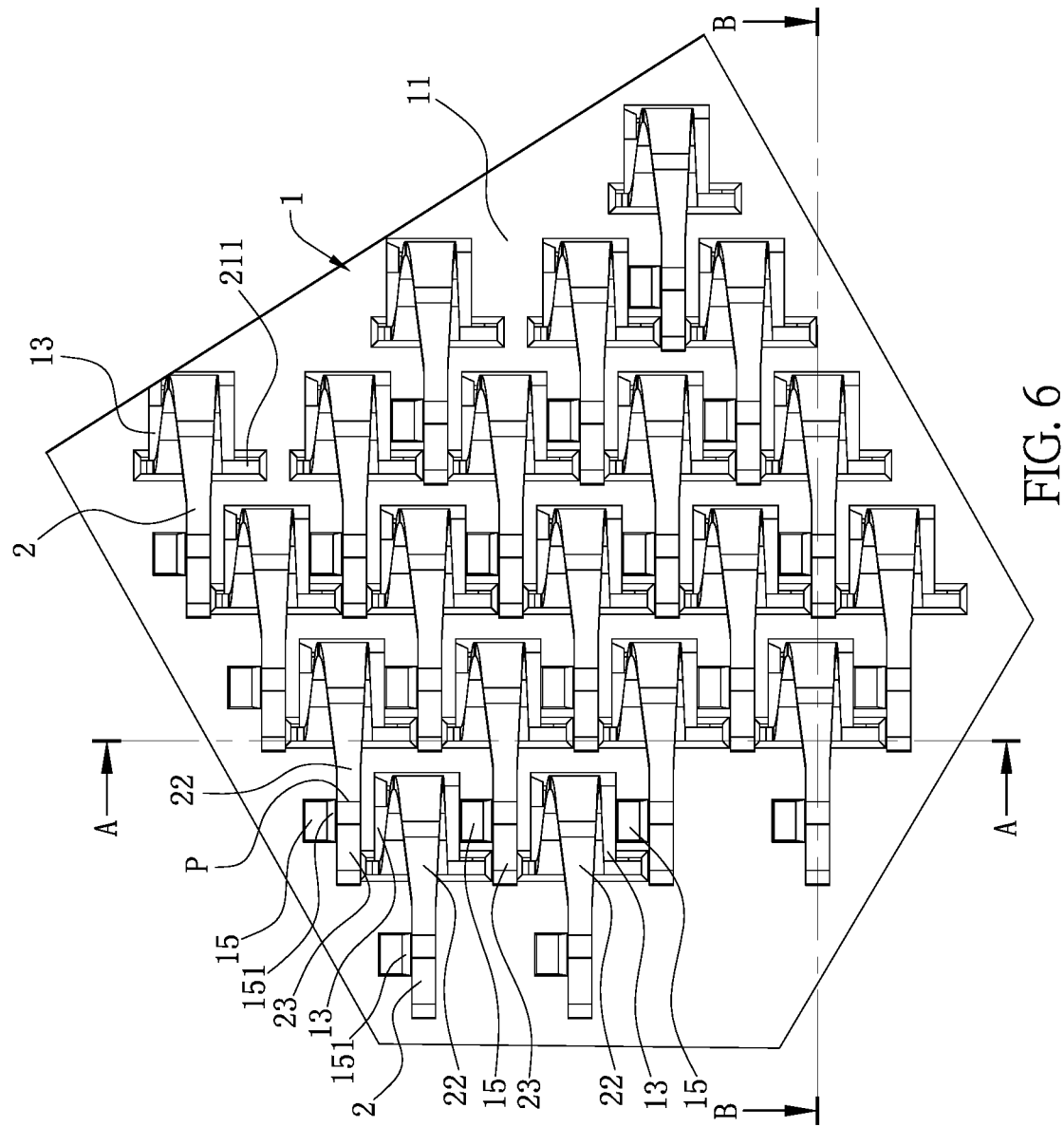
FIG. 6 is a top view of the electrical connector in FIG. 4.
Figure 8:
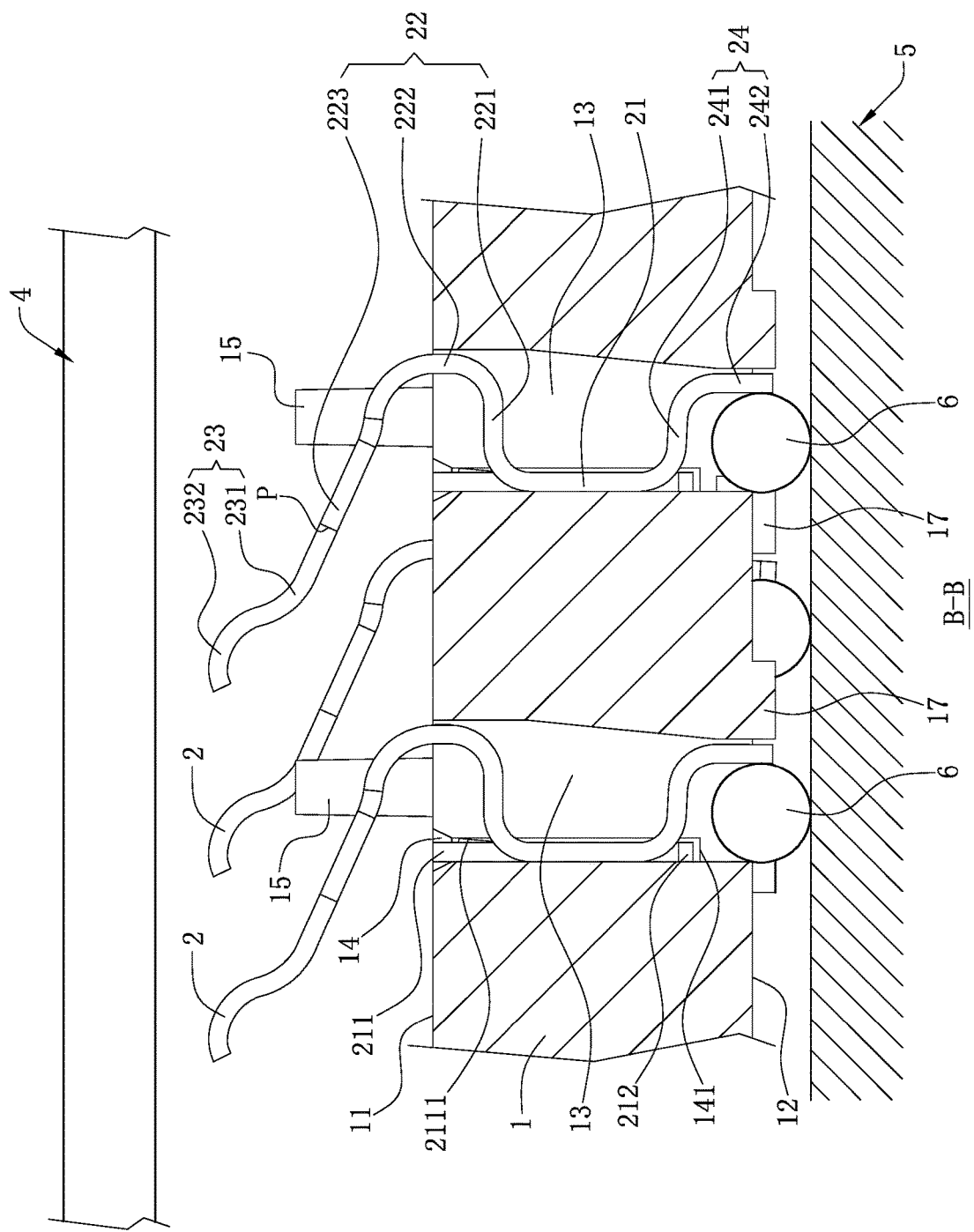
FIG. 8 is a sectional view of the electrical connector in FIG. 6 along a B-B direction.

FIG. 4, FIG. 6, and FIG. 8 show an electrical connector 100 according to certain embodiments of the present invention. The electrical connector 100 is configured to electrically connect a chip module 4 to a circuit board 5, and includes a body 1 used to carry upward the chip module 4 and a plurality of terminals 2 accommodated in the body 1. Each terminal 2 is soldered to the circuit board 5 by a solder ball 6.

The body 1 is made by an insulating material. The body 1 has an upper surface 11 and a lower surface 12 opposite to each other. The body 1 is provided with a plurality of accommodating holes 13 running through the upper surface 11 and the lower surface 12 along a vertical direction. The accommodating holes 13 are arranged in multiple rows, and the accommodating holes 13 in two adjacent rows are disposed in a staggered manner.

Figure 7:
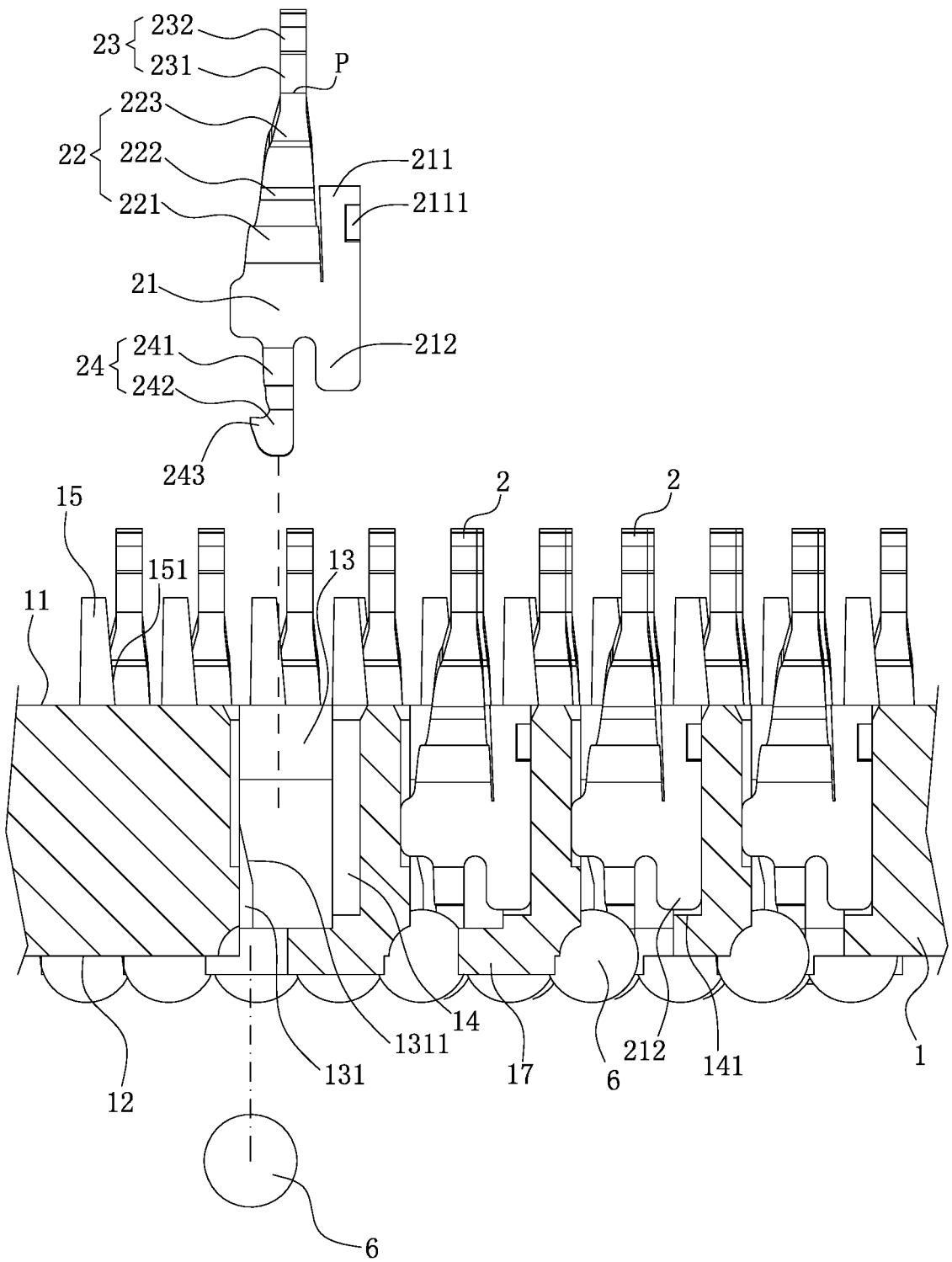
FIG. 7 is a sectional view of the electrical connector in FIG. 6 along an A-A direction.

As shown in FIG. 4, FIG. 6, and FIG. 7, a fastening block 131 is protrudingly provided in each accommodating hole 13, and the fastening block 131 has a guide surface 1311.

Multiple retaining slots 14 are downward concavely provided on the upper surface 11. The retaining slots 14 are correspondingly communicated with the accommodating holes 13, and each retaining slot 14 has a position limiting surface 141 between the upper surface 11 and the lower surface 12.

Figure 9:
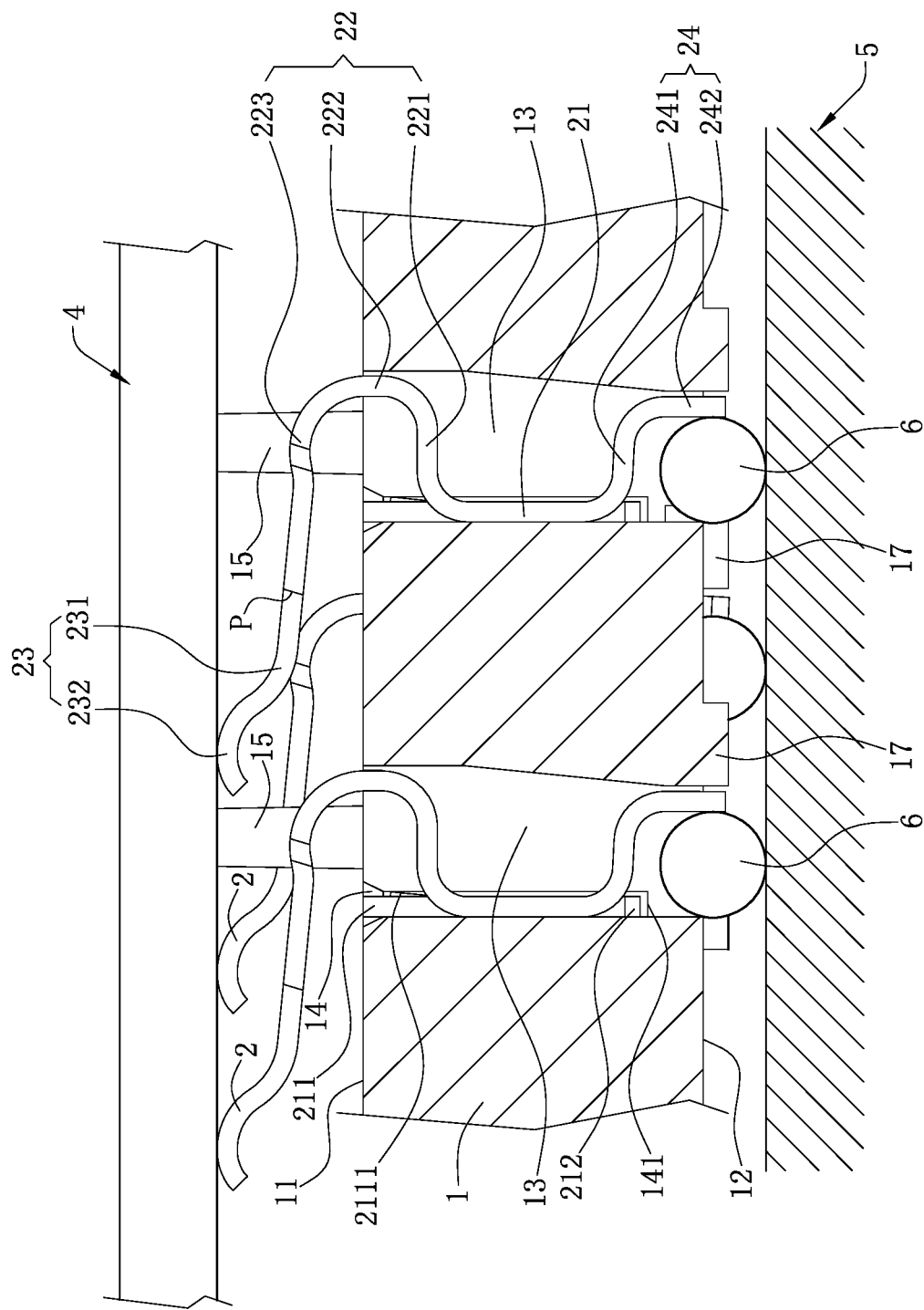
FIG. 9 is a plain view of the electrical connector in FIG. 8 after a chip module is pressed down.

Multiple supporting blocks 15 are formed by extending upward from the upper surface 11, and the supporting block 15 are used to carry upward the chip module 4 (referring to FIG. 9). Each supporting block 15 has an oblique surface 151.

Figure 5:
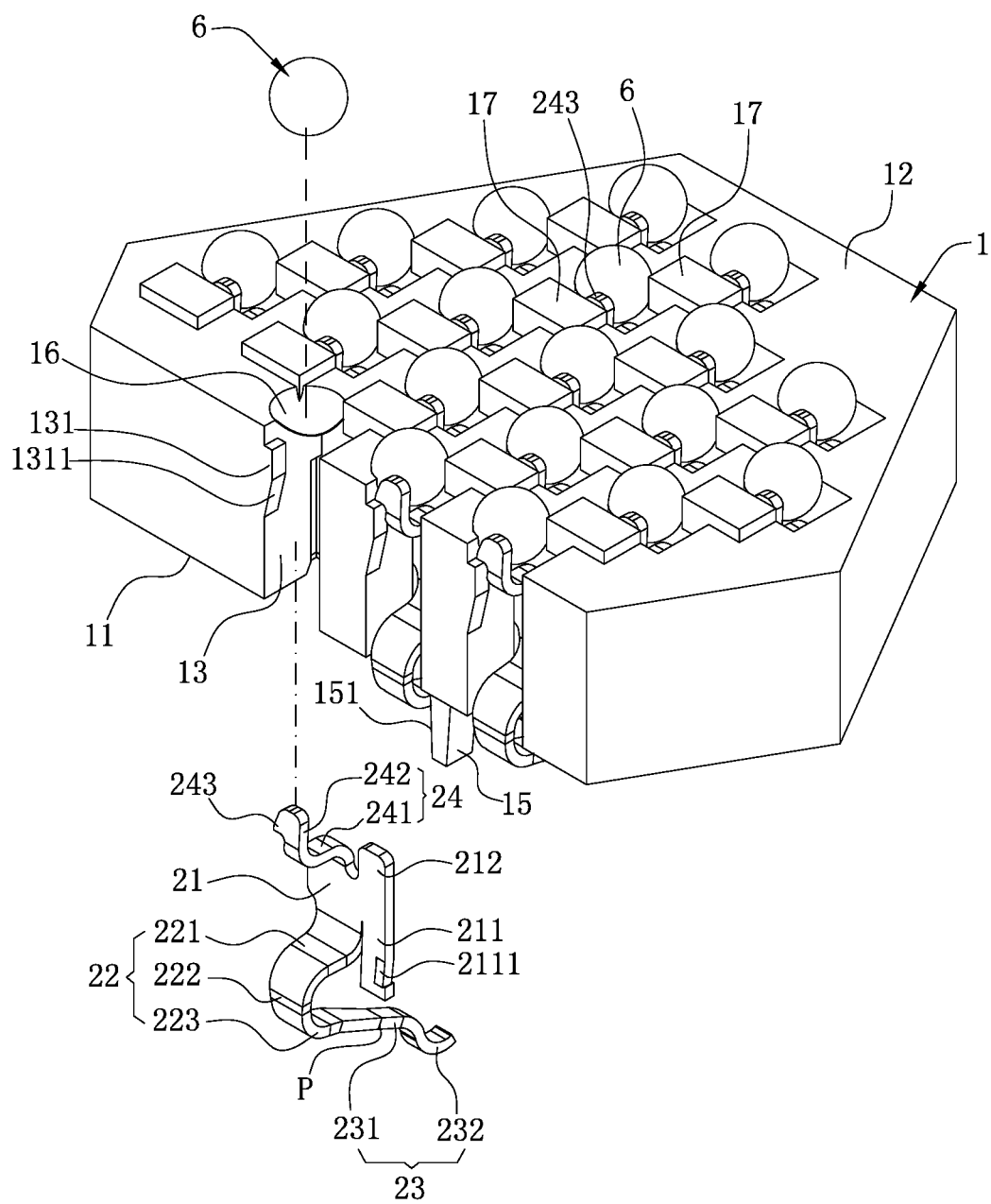
FIG. 5 is a perspective view of the electrical connector in FIG. 4, where the electrical connector is inversed by 180°.

As shown in FIG. 4 and FIG. 5, multiple accommodating grooves 16 are upward concavely provided on the lower surface 12. The accommodating grooves 16 are correspondingly communicated with the accommodating holes 13, and the shape of each accommodating groove 16 matches the shape of the solder ball 6.

Multiple protruding blocks 17 are formed by extending downward from the lower surface 12.

Figure 3:
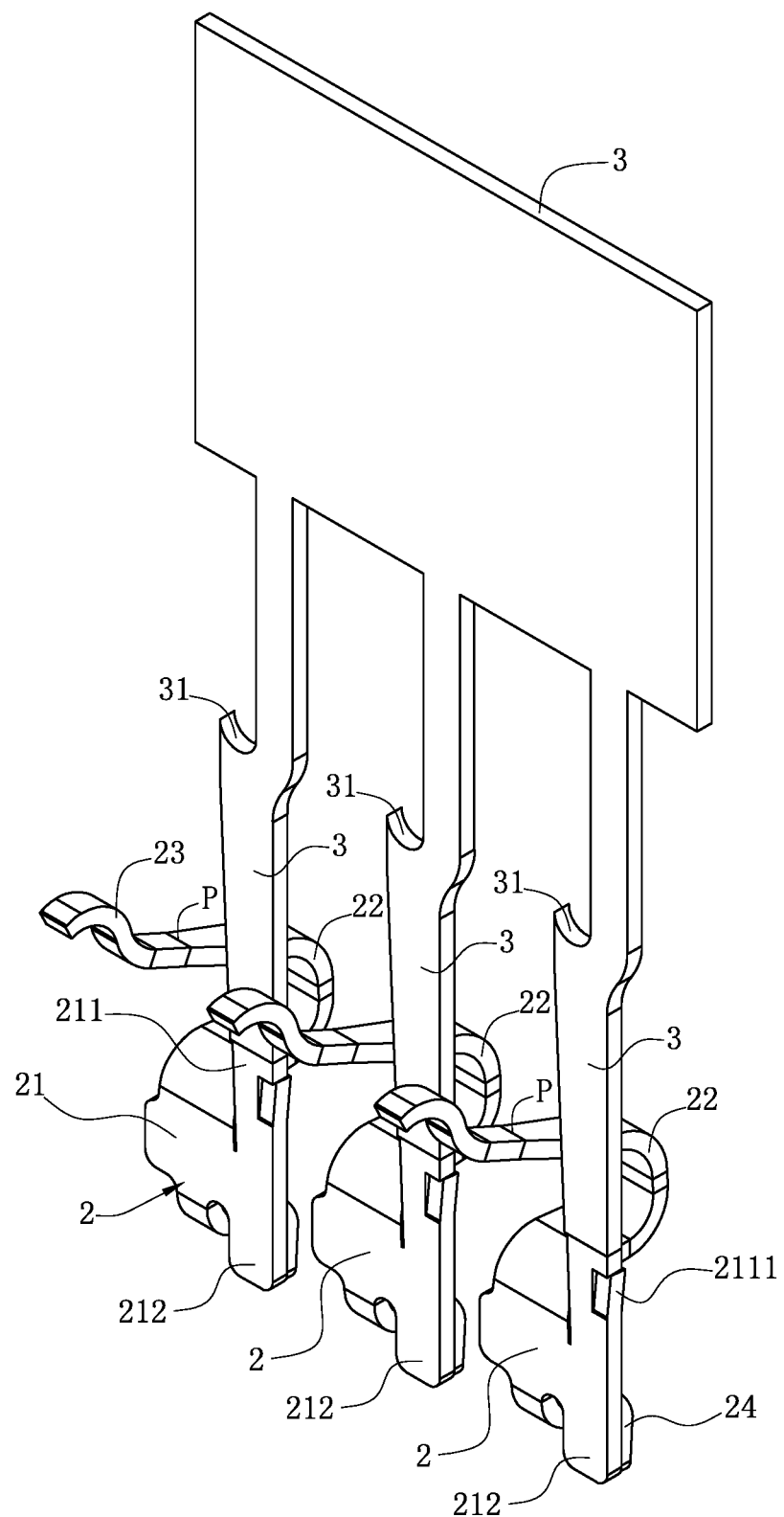
FIG. 3 is a perspective view of the terminals and the strips in FIG. 1.

As shown in FIG. 1, FIG. 3, and FIG. 4, each terminal 2 includes a base 21, a first arm 22, a second arm 23, and a soldering portion 24.

The base 21 is in a shape of a flat plate, and is used to connect to a strip 3.

The first arm 22 is formed by bending and extending upward from the base 21, and the second arm 23 is formed by bending and extending upward from the first arm 22.

As shown in FIG. 6, the second arm 23 extends to a location between two adjacent accommodating holes 13 in an adjacent row of the second arm 23, and is located between two first arms 22 in the adjacent row of the second arm 23.

The second arm 23 is located at a side of the supporting block 15 in the adjacent row of the second arm 23, and extends across the supporting block 15 in the adjacent row of the second arm 23. The first arm 22 and the second arm 23 in an adjacent row of the first arm 22 are located between two adjacent supporting blocks 15 in a same row, and the oblique surface 151 of the supporting block 15 directly faces a connection location P between the first arm 22 and the second arm 23 of the terminal 2 in an adjacent row thereof.

As shown in FIG. 1, one side of the first arm 22 is formed by tearing from the strip 3, and the other opposite side of the first arm 22 is formed by blanking the strip 3. One side of the strip 3 being torn to form the first arm 22 is obliquely provided upward and toward the first arm 22. A width of the first arm 22 gradually decreases along an extending direction of the first arm 22, and an obliquity of the torn side of the first arm 22 is less than an obliquity of the blanked side of the first arm 22.

As shown in FIG. 4 and FIG. 8, the first arm 22 includes a first section 221 formed by bending upward from the base 21 and horizontally extending away from the base 21, a second section 222 formed by bending upward from the first section 221 and extending along the vertical direction, and a third section 223 formed by bending upward from the second section 222 and extending toward the base 21. The third section 223 extends across a vertical plane on which the base 21 is located.

As shown in FIG. 1, the second arm 23 is used to abut the chip module 4, and two opposite sides of the second arm 23 are both formed by blanking the strip 3. A width of the second arm 23 does not vary along an extending direction of the second arm 23, and an end of the second arm 23 is formed by blanking the strip 3 such that a gap exists between the end of the second arm 23 and the strip 3.

As shown in FIG. 4 and FIG. 8, the second arm 23 includes a fourth section 231 formed by bending upward and extending from the third section 223 and a fifth section 232 formed by bending upward and extending from the fourth section 231. The fourth section 231 is tangent to the fifth section 232, and the fifth section 232 abuts the chip module 4.

As shown in FIG. 1, the strip 3 has a notch 31, which is located between the second arm 23 and the strip 3. A bottom portion of the notch 31 is arc-shaped, and before the first arm 22 is torn from the strip 3, the notch 31 extends to the connection location P between the first arm 22 and the second arm 23.

Figure 2:
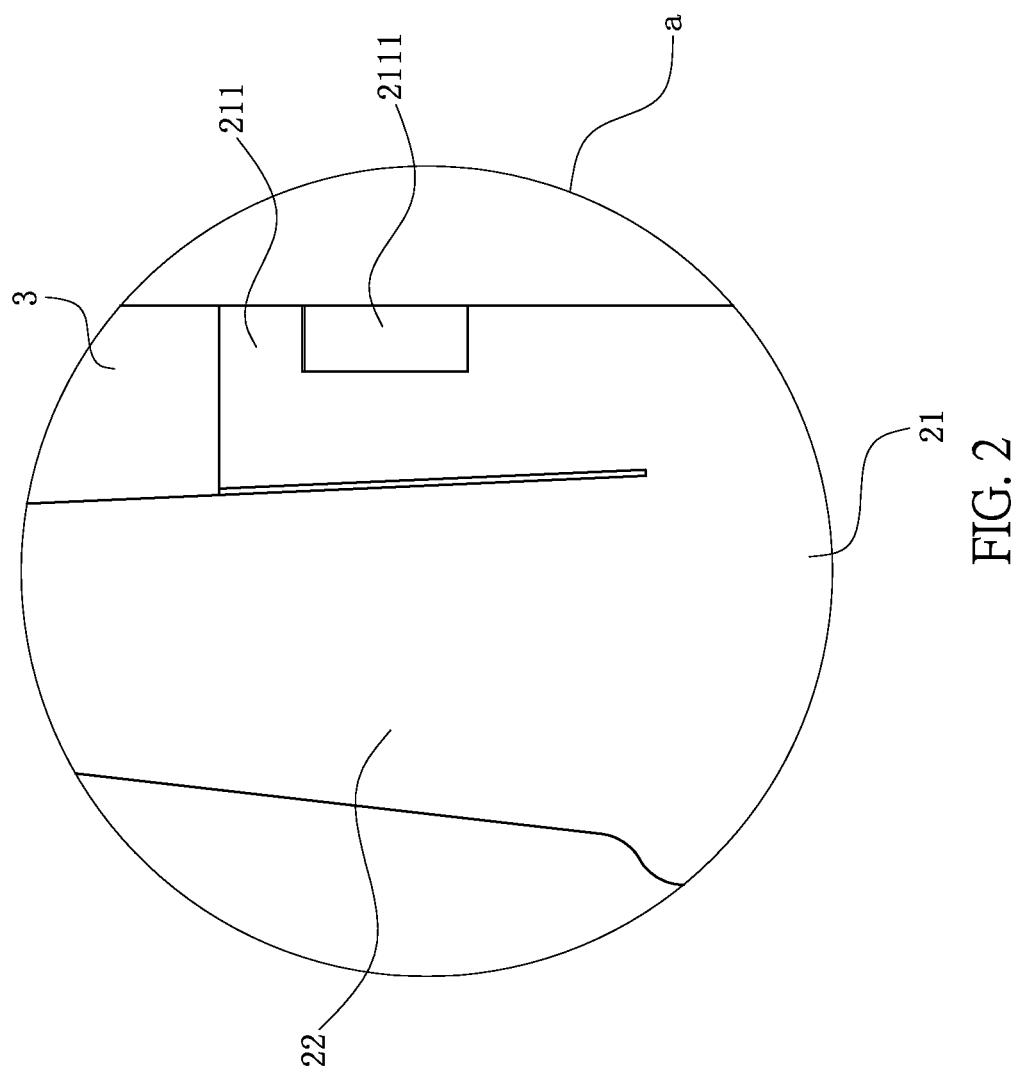
FIG. 2 is an enlarged view of a part a in FIG. 1.

As shown in FIG. 1 and FIG. 2, the base 21 has a strip connecting portion 211 extending upward to connect to the strip 3. A top surface of the strip connecting portion 211 and the upper surface 11 are flush (referring to FIG. 8), and one side of the strip connecting portion 211 is formed by blanking the first arm 22 and is obliquely provided upward and toward the first arm 22.

As shown in FIG. 4 and FIG. 8, the strip connecting portion 211 is accommodated in a corresponding one of the retaining slots 14 and partially extends into a corresponding one of the accommodating holes 13. An opposite side of the strip connecting portion 211 is punctured to form a protruding barb 2111, and the protruding barb 2111 abuts a side wall of the corresponding retaining slot 14 to fasten the terminal 2.

The soldering portion 24 is formed by bending downward and extending from the base 21 to be soldered to the solder ball 6. The soldering portion 24 and the second arm 23 are located at two opposite sides of the vertical plane on which the base 21 is located.

As shown in FIG. 5 and FIG. 8, the soldering portion 24 includes a first portion 241 formed by bending downward from the base 21 and horizontally extending away from the base 21 and a second portion 242 formed by bending downward from the first portion 241 and obliquely extending toward the base 21. An end of the second portion 242 is protrudingly provided with a hook portion 243, and a corresponding fastening block 131 is located above the hook portion 243 to limit the terminal 2 from moving upward.

The solder ball 6 is accommodated in a corresponding one of the accommodating grooves 16, and the second portion 242 and a corresponding protruding block 17 correspondingly clamp the solder ball 6. The solder ball 6 is soldered to the hook portion 243, and a gap exists between the solder ball 6 and the first portion 241.

As shown in FIG. 4 and FIG. 7, the base 21 has a position limiting portion 212 vertically extending downward, and the position limiting portion 212 is located directly below the strip connecting portion 211. A gap exists between the position limiting portion 212 and the soldering portion 24, and the position limiting surface 141 is located below the position limiting portion 212 to limit the terminal 2 from moving downward.

As shown in FIG. 3, FIG. 4, and FIG. 5, during assembly, terminals 2 in a same row are connected to a same strip 3 by the strip connecting portions 211, and then the terminals 2 are mounted into the accommodating holes 13 downward from the top. The strip connecting portions 211 are correspondingly accommodated in the retaining slots 14, and the protruding barbs 2111 correspondingly abut the side walls of the retaining slots 14. The position limiting portion 212 moves to a position above the position limiting surface 141, and the hook portion 243 moves to a position below the fastening block 131 by the guide surface 1311. Finally, the strip 3 is broken off and removed.

As shown in FIG. 8 and FIG. 9, during operation, the electrical connector 100 is first placed on the circuit board 5, and the electrical connector 100 is soldered and fastened to the circuit board 5 by the solder ball 6. Then, the chip module 4 is mounted to the electrical connector 100, and a downward action force is applied to the chip module 4, such that the chip module 4 downward abuts the terminal 2 until the supporting block 15 supports upward the chip module 4.

To sum up, the electrical connector according to certain embodiments of the present invention has the following beneficial effects:

(1). One side of the first arm 22 is formed by tearing from the strip 3, which not only saves the material of the strip 3 and facilitates cost saving, but also ensures the strength of the first arm 22 and the strength at a connection location between the strip 3 and the base 21. Moreover, the two opposite sides of the second arm 23 are both formed by blanking the strip 3, such that burrs formed on the two opposite sides of the second arm 23 are located on a same surface of the second arm 23, and the other surface of the second arm 23 that does not have burrs is controlled to abut the chip module 4, thus effectively preventing the burrs from scratching the chip module 4, and ensuring the stable electrical connection between the second arm 23 and the chip module 4.

(2). One side of the strip connecting portion 211 adjacent to the first arm 22 is obliquely disposed upward and toward the first arm 22, thus increasing a connection area between the strip connecting portion 211 and the strip 3, so as to increase the strength at a junction between the strip connecting portion 211 and the strip 3.

(3). The strip 3 has the notch 31, and the notch 31 is located between the second arm 23 and the strip 3. Before the first arm 22 is torn from the strip 3, the notch 31 extends to the connection location P between the first arm 22 and the second arm 23, thus facilitating forming of the first arm 22 by tearing from the strip 3.

(4). The end of the second arm 23 is formed by blanking the strip 3 such that a gap exists between the end of the second arm 23 and the strip 3, thereby ensuring that the burrs formed at the end of the second arm 23 and the burrs formed at the two opposite sides of the second arm 23 are located on a same surface of the second arm 23, and further preventing the burrs from scratching the chip module 4.

(5). The same sides of the first arm 22 and the second arm 23 are both formed by blanking the strip 3, such that appearances of the structures at the same sides of the first arm 22 and the second arm 23 can be manufactured at one time, thereby facilitating cost saving.

(6). The second arm 23 extends to the location between the two adjacent accommodating holes 13 in the adjacent row of the second arm 23, and is located between the two first arms 22 in the adjacent row of the second arm 23, such that the arrangement of the terminals 2 in adjacent rows are more compact, and the quantity of the terminals 2 can be increased under the premise that the volume of the body 1 remains the same, thus expanding the electrical performance of the electrical connector 100.

(7). Each supporting block 15 is provided with the oblique surface 151, and the oblique surface 151 gives way to the connection location P between the first arm 22 and the second arm 23 of the terminal 2 in an adjacent row thereof, thus facilitating the chip module 4 to press down the second arm 23, so as to ensure the stable electrical connection between the chip module 4 and the second arm 23.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An electrical connector, configured to be electrically connected to a chip module, comprising:
   a body, configured to carry upward the chip module, and provided with a plurality of accommodating holes; and
   a plurality of terminals, respectively correspondingly accommodated in the accommodating holes, wherein each of the terminals comprises a base, a first arm and a second arm, the base is configured to be connected to a strip, the first arm is formed by extending upward from the base, and the second arm is formed by extending upward from the first arm and is configured to abut the chip module,
   wherein one side of the first arm is formed by tearing from the strip, and two opposite sides of the second arm are both formed by blanking the strip, burrs formed on the two opposite sides of the second arm are located on a same surface of the second arm, and another surface of the second arm that does not have burrs is configured to abut the chip module.

2. The electrical connector according to claim 1, wherein the base has a strip connecting portion extending upward and configured to be connected to the strip, and one side of the strip connecting portion adjacent to the first arm is obliquely provided upward and toward the first arm.

3. The electrical connector according to claim 2, wherein the body is concavely provided with a plurality of retaining slots respectively communicating with the accommodating holes, the strip connecting portion is correspondingly accommodated in a corresponding one of the retaining slots and partially extends into a corresponding one of the accommodating holes, an opposite side of the strip connecting portion is punctured to form a protruding barb, and the protruding barb abuts a side wall of the corresponding one of the retaining slots.

4. The electrical connector according to claim 1, wherein the strip has a notch, the notch is located between the second arm and the strip, and before the first arm is torn from the strip, the notch extends to a connection location between the first arm and the second arm.

5. The electrical connector according to claim 4, wherein an end of the second arm is formed by blanking the strip such that a gap exists between the end of the second arm and the strip.

6. The electrical connector according to claim 1, wherein an opposite side of the first arm is formed by blanking the strip.

7. The electrical connector according to claim 6, wherein a width of the first arm gradually decreases along an extending direction of the first arm, the two opposite sides of the first arm are obliquely provided along the extending direction of the firm arm, and an obliquity of the torn side of the first arm is less than an obliquity of the blanked side of the first arm.

8. The electrical connector according to claim 1, wherein the second arm extends to a location between two adjacent ones of the accommodating holes in an adjacent row thereof, and is located between two first arms of the adjacent row thereof.

9. The electrical connector according to claim 1, wherein the first arm comprises a first section formed by bending upward from the base and horizontally extending away from the base, a second section formed by bending upward from the first section and extending along a vertical direction, and a third section formed by bending upward from the second section and obliquely extending toward the base, and the third section extends across a vertical plane on which the base is located.

10. The electrical connector according to claim 1, wherein the second arm comprises a fourth section formed by bending upward and extending from the first arm, and a fifth section formed by bending upward and extending from the fourth section, the fourth section is tangent to the fifth section, and the fifth section abuts the chip module.

11. The electrical connector according to claim 1, wherein a soldering portion is formed by bending downward and extending from the base to be soldered to a solder ball, the soldering portion comprises a first portion formed by bending downward from the base and horizontally extending away from the base, and a second portion formed by bending downward from the first portion and obliquely extending toward to the base, an end of the second portion is protrudingly provided with a hook portion, and each of the accommodating holes is correspondingly provided with a fastening block located above the hook portion to limit the corresponding terminal from moving upward.

12. The electrical connector according to claim 11, wherein a bottom surface of the body is downward protrudingly provided with a plurality of protruding blocks, the second portion and one of the protruding blocks correspondingly clamp the solder ball, and a gap exists between the first portion and the solder ball.

13. The electrical connector according to claim 11, wherein a bottom surface of the body is upward concavely provided with a plurality of accommodating grooves, the accommodating grooves are correspondingly communicated with the accommodating holes, and the solder ball is accommodated in one of the accommodating grooves and is soldered to the hook portion.

14. The electrical connector according to claim 11, wherein the base has a position limiting portion extending downward, a gap exists between the position limiting portion and the soldering portion, and each of the accommodating holes is correspondingly provided with a position limiting surface located below the position limiting portion to limit the corresponding terminal from moving downward.

15. The electrical connector according to claim 11, wherein the soldering portion and the second arm are located at two opposite sides of a vertical plane on which the base is located.

16. The electrical connector according to claim 1, wherein a plurality of supporting blocks is formed by extending upward from the body to carry upward the chip module, and the second arm is located at a side of the supporting block in an adjacent row thereof and extends across the supporting block in the adjacent row thereof.

17. The electrical connector according to claim 16, wherein each of the supporting blocks is provided with an oblique surface, and the oblique surface directly faces a connection location between the first arm and the second arm of the terminal in an adjacent row thereof.

18. The electrical connector according to claim 16, wherein the first arm and the second arm in an adjacent row of the first arm are located between two of the supporting blocks in a same row.

19. The electrical connector according to claim 1, wherein one side of the strip being torn to form the first arm is obliquely provided upward and toward the first arm.

* * * * *